US011251067B2

(12) United States Patent
West et al.

(10) Patent No.: US 11,251,067 B2
(45) Date of Patent: Feb. 15, 2022

(54) PEDESTAL LIFT FOR SEMICONDUCTOR PROCESSING CHAMBERS

(71) Applicant: Applied Materials, Inc., Santa Clara, CA (US)

(72) Inventors: Brian T. West, San Jose, CA (US); Miroslav Gelo, Oakley, CA (US); Yan Rozenzon, San Carlos, CA (US); Roger M. Johnson, Livermore, CA (US); Mark Covington, Santa Clara, CA (US); Soundarrajan Jembulingam, Bangalore (IN); Simon Nicholas Binns, East Palo Alto, CA (US); Vivek Vinit, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 273 days.

(21) Appl. No.: 16/396,181

(22) Filed: Apr. 26, 2019

(65) Prior Publication Data
US 2020/0343126 A1 Oct. 29, 2020

(51) Int. Cl.
*H02P 8/30* (2006.01)
*H01L 21/687* (2006.01)
(Continued)

(52) U.S. Cl.
CPC ........ *H01L 21/68742* (2013.01); *C23C 14/34* (2013.01); *C23C 14/50* (2013.01);
(Continued)

(58) Field of Classification Search
None
See application file for complete search history.

(56) References Cited

U.S. PATENT DOCUMENTS 4,923,584 A * 5/1990 Bramhall, Jr. .... H01L 21/67126
118/719
5,664,470 A * 9/1997 Garnett ................ B23Q 1/0036
408/56
(Continued)

FOREIGN PATENT DOCUMENTS

JP 2001053132 A 2/2001
KR 20040070778 A 8/2004
(Continued)

OTHER PUBLICATIONS

International Search Report and Written Opinion for PCT/US2020/026022 dated Jul. 10, 2020.

*Primary Examiner* — Jason Berman
(74) *Attorney, Agent, or Firm* — Patterson + Sheridan, LLP

(57) ABSTRACT

Implementations described herein provide a pedestal lift assembly for a plasma processing chamber and a method for using the same. The pedestal lift assembly has a platen configured to couple a shaft of a pedestal disposed in the plasma processing chamber. An absolute linear encoder is coupled to a fixed frame wherein the absolute linear encoder is configured to detect incremental movement of the platen. A lift rod is attached to the platen. A motor rotor encoder brake module (MRBEM) is coupled to the fixed frame and moveably coupled to the lift rod, the motor encoder brake module configured to move the lift rod in a first direction and a second direction, wherein the movement of the lift rod results in the platen traveling vertically relative to the fixed frame.

21 Claims, 3 Drawing Sheets

(51) Int. Cl.
*H01J 37/32* (2006.01)
*C23C 14/50* (2006.01)
*C23C 14/34* (2006.01)
*H02P 8/28* (2006.01)

(52) U.S. Cl.
CPC .. *H01J 37/32715* (2013.01); *H01J 37/32733* (2013.01); *H02P 8/28* (2013.01); *H02P 8/30* (2013.01); *H01J 2237/20235* (2013.01); *H01J 2237/332* (2013.01)

(56) References Cited

U.S. PATENT DOCUMENTS

| | | | |
|---|---|---|---|
| 5,772,773 | A | 6/1998 | Wytman |
| 5,951,776 | A | 9/1999 | Selyutin et al. |
| 6,146,504 | A | 11/2000 | Patadia et al. |
| 6,193,199 | B1 * | 2/2001 | Karam, II ............. G02B 21/26 248/276.1 |
| 6,361,674 | B1 | 3/2002 | Franklin |
| 6,645,303 | B2 | 11/2003 | Frankel et al. |
| 7,871,470 | B2 | 1/2011 | Schieve et al. |
| 2001/0029892 | A1 * | 10/2001 | Cook ................ H01L 21/67742 118/723 E |
| 2014/0299582 | A1 * | 10/2014 | Mizuno ................. B23K 20/02 219/78.02 |
| 2018/0096874 | A1 | 4/2018 | Schaller et al. |

FOREIGN PATENT DOCUMENTS

| | | |
|---|---|---|
| KR | 20080037785 A | 5/2008 |
| WO | 9205922 A1 | 4/1992 |

* cited by examiner

PEDESTAL LIFT FOR SEMICONDUCTOR PROCESSING CHAMBERS

BACKGROUND OF THE INVENTION

Field of the Invention

The embodiments herein generally relate to a substrate processing system and method for using the same. In particular, the method and apparatus disclose an improved lift mechanism for a substrate support.

Description of the Related Art

In semiconductor processing chambers, a substrate can undergo a variety of plasma processing operations such as deposition, etching, and annealing in plasma processing chambers such as a physical vapor deposition (PVD), chemical vapor deposition (CVD), plasma enhanced CVD (PECVD) or other chamber. In the formation of devices and features on the substrates in these semiconductor processing chambers, a substrate is placed onto a top surface of a substrate support for holding the substrate for plasma processing, such as an etch operation.

Reliably producing nanometer and smaller features is one of the key technology challenges for next generation semiconductor devices. However, as the limits of circuit technology are pushed, the shrinking dimensions of the semiconductor devices interconnect technology have placed additional demands on processing capabilities in the semiconductor processing chambers. Reliable formation of gate structures on the substrate is important to increase circuit density and quality of individual substrates and the features formed therein.

To drive down manufacturing cost, integrated chip (IC) manufactures demand higher throughput and better device yield and performance from every silicon substrate processed. However, as temperatures increases in the processes utilized in the formation of these next generation devices and as chamber components wear, maintaining critical process parameters within acceptable ranges becomes challenging for maintaining satisfactory device quality and yields. For example, a process parameter for the distance of the substrate disposed on a pedestal to a target or showerhead is controlled to maintain exacting etch or deposition performance.

Conventional pedestals typically utilize a stepper motor for driving a lead screw via a belt drive for controlling the elevation of the pedestal. The screw/drive nut assembly is often mounted in low quality bearings. With all the tolerance and hysteresis in the drive, the precision of the pedestal position is around +/−20 um at best. Further there is no feedback from the drive for when motor counts are lost leading to cumulative errors and making elevation accuracy of the substrate disposed on a pedestal relative to a target difficult to ascertain.

As such, there is a need in the art to reduce manufacturing variability while maintaining good processing results.

SUMMARY

Implementations described herein provide a pedestal lift assembly for a plasma processing chamber and a method for using the same. The pedestal lift assembly has a platen configured to couple a shaft of a pedestal disposed in the plasma processing chamber. An absolute linear encoder is coupled to a fixed frame wherein the absolute linear encoder is configured to detect incremental movement of the platen. A lift rod is attached to the platen. A motor rotor encoder brake module (MRBEM) is coupled to the fixed frame and moveably coupled to the lift rod, the motor encoder brake module configured to move the lift rod in a first direction and a second direction, wherein the movement of the lift rod results in the platen traveling vertically relative to the fixed frame.

In another embodiment, a plasma processing chamber has a body. The body has a lid, one or more walls, and a bottom. The lid, walls and bottom define an internal processing volume. A substrate support assembly is disposed in the interior volume. The substrate support assembly has a pedestal and a shaft coupled to the pedestal. The shaft extends from the internal processing volume through the bottom of the body. Aa pedestal lift assembly is coupled to the shaft and configured to move the pedestal vertically. The pedestal lift assembly has a platen configured to couple a shaft of a pedestal disposed in the plasma processing chamber thereto. An absolute linear encoder is coupled to a fixed frame wherein the absolute linear encoder is configured to detect incremental movement of the platen. A lift rod is attached to the platen. A motor rotor encoder brake module (MRBEM) is coupled to the fixed frame and moveably coupled to the lift rod, the motor encoder brake module configured to move the lift rod in a first direction and a second direction, wherein the movement of the lift rod results in the displacement of the platen.

In another embodiment, a method for processing a substrate in a plasma processing chamber. The method begins by placing a substrate on a pedestal attached to a lift via a shaft. The pedestal is moved vertically upward by a moving assembly of the high precision lift to a predefined elevated location. A location of the pedestal is determined using an absolute linear encoder. Upon the absolute linear encoder determining the location of the pedestal is approaching the predefined elevated location, the movement of the pedestal is slowed down using the servo motor. The servo motor is stopped to prevent further movement of the pedestal upon the absolute linear encoder determining the location of the pedestal is positioned at or near the predefined elevated location.

BRIEF DESCRIPTION OF THE DRAWING

So that the manner in which the above recited features of the present disclosure can be understood in detail, a more particular description of the disclosure, briefly summarized above, may be had by reference to examples herein, some of which are illustrated in the appended drawings. It is to be noted, however, that the appended drawings illustrate only examples and are therefore not to be considered limiting of its scope, and may admit to other equally effective examples.

DETAILED DESCRIPTION

Examples disclosed herein generally relate a pedestal lift assembly with high positional precision capabilities repeatable in the vertical direction. The lift assembly utilizes a linear absolute encoder to directly determine the position of the pedestal, rather than through a complex drive assembly having numerous points of play or hysteresis.

The high precision lift assembly utilizes a high precision preloaded ball screw to drive the lift. The ball screw is built as an extension of the armature of the servo motor (could also be a stepper if micro-stepped) such that substantially all of the imprecision and hysteresis of the belt drive, pulley and bearing supported conventional drives are eliminated. The servo motor has effective step count of greater than 130,000 steps per revolution and a 4 mm per revolution pitch ball screw. The effective number of steps per mm is greater than 32,000 or about 0.03 um. It should be appreciated that lower step counts are also viable.

Further, the actual motion of the pedestal clamp is coupled to the base through an absolute linear encoder capable of 0.5 um resolution or encoders having even higher precision. The encoder is directly mounted to the base of the chamber and the moving platen such that and variability in the drive is excluded from the motion measured by the encoder. It reads the exact motion of the platen relative to the chamber and therefore the motion of the pedestal with is hard mounted to the platen. The encoder can be calibrated once during installation and, as it is an absolute encoder, thereafter knows its exact location permanently even after loss of power. This eliminates the frequent home cycles (determining a baseline pedestal position) required for conventional lift assemblies, and thus, eliminates the cumulative errors caused by frequent homing needed in the conventional lift assemblies.

Advantageously, the high precision lift mechanism for the pedestal eliminates the homing cycle, has improved positional accuracy and repeatability. The high precision lift mechanism further benefits from longevity from superior and fewer components leading to a lower cost of maintenance in parts, labor and system down time.

Figure 1:
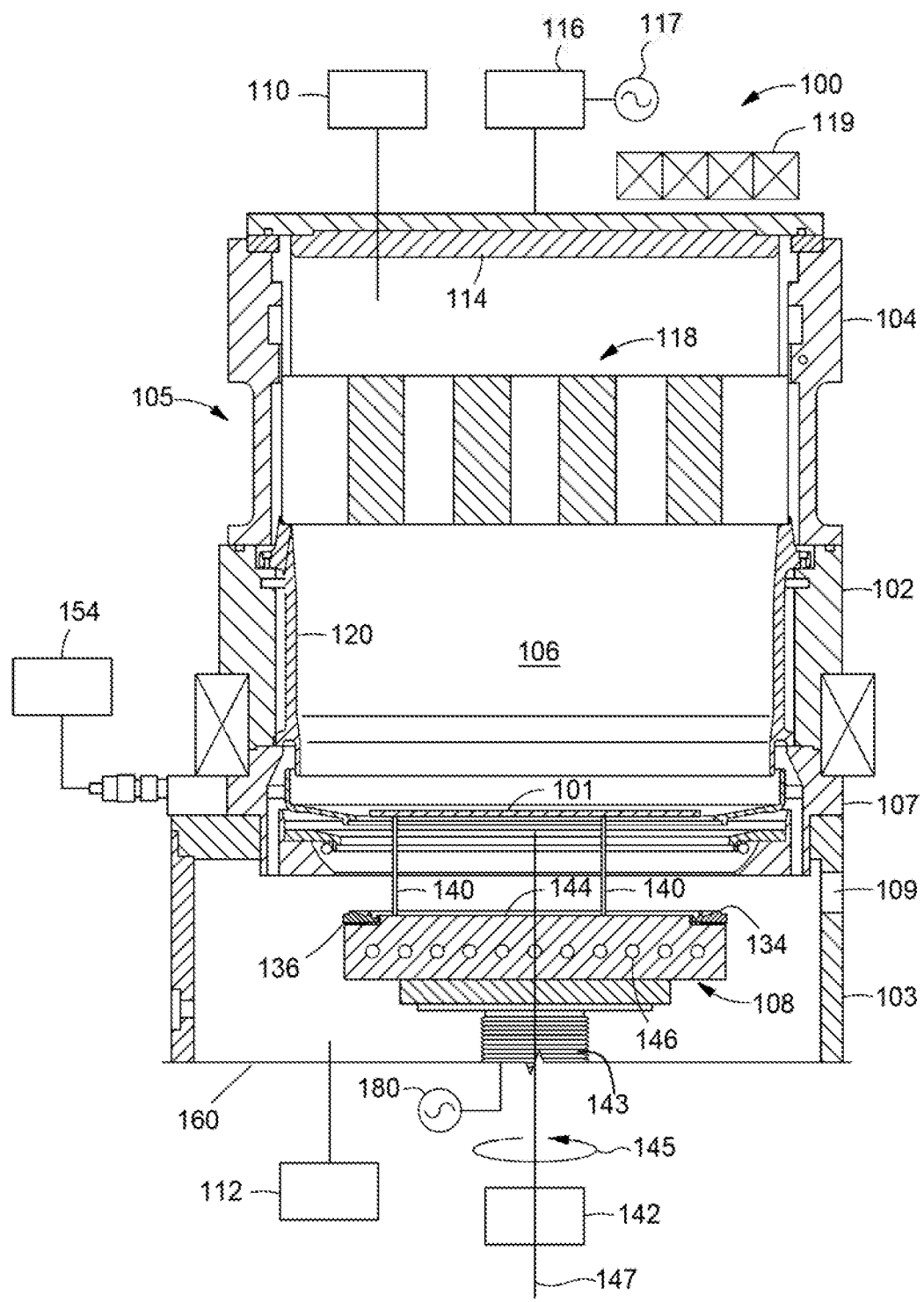
FIG. 1 is a schematic side plan view of an exemplary processing chamber for processing a substrate disposed on a substrate support assembly.

FIG. 1 is a schematic cross-sectional view of a processing chamber 100 having a substrate support assembly 144 according to one embodiment The processing chamber 100 illustrates an exemplary physical vapor deposition (PVD) chamber (e.g., a sputter process chamber) suitable for sputter depositing materials according to one embodiment of the disclosure. Examples of suitable PVD chambers include the ALPS® Plus and SIP ENCORE® PVD processing chambers, both commercially available from Applied Materials, Inc., Santa Clara, of California. It is contemplated that processing chambers available from other manufactures may also be adapted to benefit from the technology described herein. It is additionally contemplated that other processing chambers, such as atomic layer deposition, chemical vapor deposition, etch, etc. may be adapted to benefit from the disclosure herein. In one embodiment, the processing chamber 100 is suitable for depositing, for example, titanium, aluminum oxide, aluminum, aluminum oxynitride, copper, tantalum, tantalum nitride, tantalum oxynitride, titanium oxynitride, tungsten, or tungsten nitride on a substrate 101.

The processing chamber 100 has an upper sidewall 102, a lower sidewall 103, and a bottom wall 160. A lid portion 104 is disposed on the body 105 and encloses an interior volume 106. An adapter plate 107 may be disposed between the upper sidewall 102 and the lower sidewall 103. A substrate transfer port 109 is formed in the lower sidewall 103 for transferring the substrate 101 into and out of the interior volume 106.

A gas source 110 is coupled to the processing chamber 100 to supply process gases into the interior volume 106. In one embodiment, process gases may include inert gases, non-reactive gases, and reactive gases if necessary. Examples of process gases that may be provided by the gas source 110 include, but not limited to, argon gas (Ar), helium (He), neon gas (Ne), nitrogen gas ($N_2$), oxygen gas ($O_2$), among others.

A pumping device 112 is coupled to the processing chamber 100 in communication with the interior volume 106 to control the pressure of the interior volume 106. In one embodiment, the pressure level of the processing chamber 100 may be maintained at about 1 Torr or less. In another embodiment, the pressure level of the processing chamber 100 may be maintained at about 500 milliTorr or less. In yet another embodiment, the pressure level of the processing chamber 100 may be maintained at about 1 milliTorr and about 300 milliTorr.

The lid portion 104 may support a sputtering source 114, such as a target. In one embodiment, the sputtering source 114 may be fabricated from a material containing titanium (Ti) metal, tantalum metal (Ta), tungsten (W) metal, cobalt (Co), nickel (Ni), copper (Cu), aluminum (Al), alloys thereof, combinations thereof, or the like. In an exemplary embodiment depicted herein, the sputtering source 114 may be fabricated by titanium (Ti) metal, tantalum metal (Ta) or aluminum (Al) as well as numerous alloys such as aluminum copper, aluminum silicon, aluminum scandium and several dielectrics such as aluminum oxide, lithiumphosphoroxynitride among other materials.

The sputtering source 114 may be coupled to a source assembly 116 comprising a power supply 117 for the sputtering source 114. A set of magnet 119 may be coupled adjacent to the sputtering source 114 which enhances efficient sputtering materials from the sputtering source 114 during processing. Examples of the magnetron assembly include an electromagnetic linear magnetron, a serpentine magnetron, a spiral magnetron, a double-digitated magnetron, a rectangularized spiral magnetron, among others.

An RF power source 180 may also be coupled to the processing chamber 100 through a pedestal 108 (or called substrate support), disposed in the interior volume 106, to provide a bias power between the sputtering source 114 and the pedestal 108 as needed. In one embodiment, the RF power source 180 may have a frequency between about 1 MHz and about 100 MHz, such as about 13.56 MHz.

A collimator 118 may be positioned in the interior volume 106 between the sputtering source 114 and the pedestal 108. A shield tube 120 may be in proximity to the collimator 118 and interior of the lid portion 104. The collimator 118 includes a plurality of apertures to direct gas and/or material flux within the interior volume 106. The collimator 118 may be mechanically and electrically coupled to the shield tube 120. In one embodiment, the collimator 118 may be coupled to an electrical power source and/or electrically coupled to the lid portion 104 of the body 105 of the processing chamber 100.

A substrate support assembly 144 is disposed in the interior volume 106 below the sputtering source 114. The substrate support assembly 144 has a substrate support, such as the pedestal 108, and a shaft 143. The Pedestal 108 is coupled to the shaft 143. The shaft 413 extends through the bottom wall 160 of the chamber body 105. A bellows may form a seal around the shaft 143 and protect the shaft 143 from the chamber environment as well as maintaining the vacuum pressure inside the processing chamber 100. The pedestal 108 may rotate along an axis 147, such as indicated by arrow 145. Additionally, the pedestal 108 is moveable in a vertical direction, i.e., moves up and down, along with the substrate support assembly 144 as necessary during processing.

An edge ring 136 is disposed on the pedestal 108. The substrate 101 (shown supported on lift pins 140) is centered relative to the longitudinal axis of the pedestal 108 by coordinated positioning calibration between the pedestal 108 and a robot blade (not shown). In this manner, the substrate 101 may be centered within the processing chamber 100 during processing.

In operation, a robot blade (not shown) having a substrate 101 thereon is extended through the substrate transfer port 109. The pedestal 108 may be lowered to allow the substrate 400 to be transferred to the lift pins 140 extending from the pedestal 108 by retracting the lift pins 140. Lifting and lowering of the pedestal 108 and/or the lift pins 140 may be controlled by a drive 142 coupled to the pedestal 108. The substrate 101 may be lowered onto a substrate receiving surface 144 of the pedestal 108. With the substrate 101 positioned on the substrate receiving surface 144 of the pedestal 108, sputter depositions may be performed on the substrate 101. The edge ring 136 may be electrically insulated from the substrate 101 during processing. Therefore, the substrate receiving surface 144 may include a height that is greater than a height of portions of the edge ring 136 adjacent the substrate 101 such that the substrate 101 is prevented from contacting the edge ring 136. During sputter deposition, the temperature of the substrate 101 may be controlled by utilizing thermal control channels 146 disposed in the pedestal 108.

Material is sputtered from the sputtering source 114 and deposited on the surface of the substrate 101. The sputtering source 114 and the substrate support pedestal 108 are biased relative to each other by the power supply 117 or 180 to maintain a plasma formed from the process gases supplied by the gas source 110. The ions from the plasma are accelerated toward and strike the sputtering source 114, causing target material to be dislodged from the sputtering source 114. The dislodged target material, optionally reactive with the process gases, forms a layer on the substrate 101 with a desired composition. During processing, the substrate 101 is spaced from the sputtering source 114 by the pedestal 108. A lift assembly 200, shown in FIG. 2, controls the vertical movement of the pedestal 108 and the spacing of the substrate 101 from the sputtering source 114. The lift assembly 200 is a high precision lift mechanism which reduces manufacturing variability while maintaining good processing results.

Figure 2:
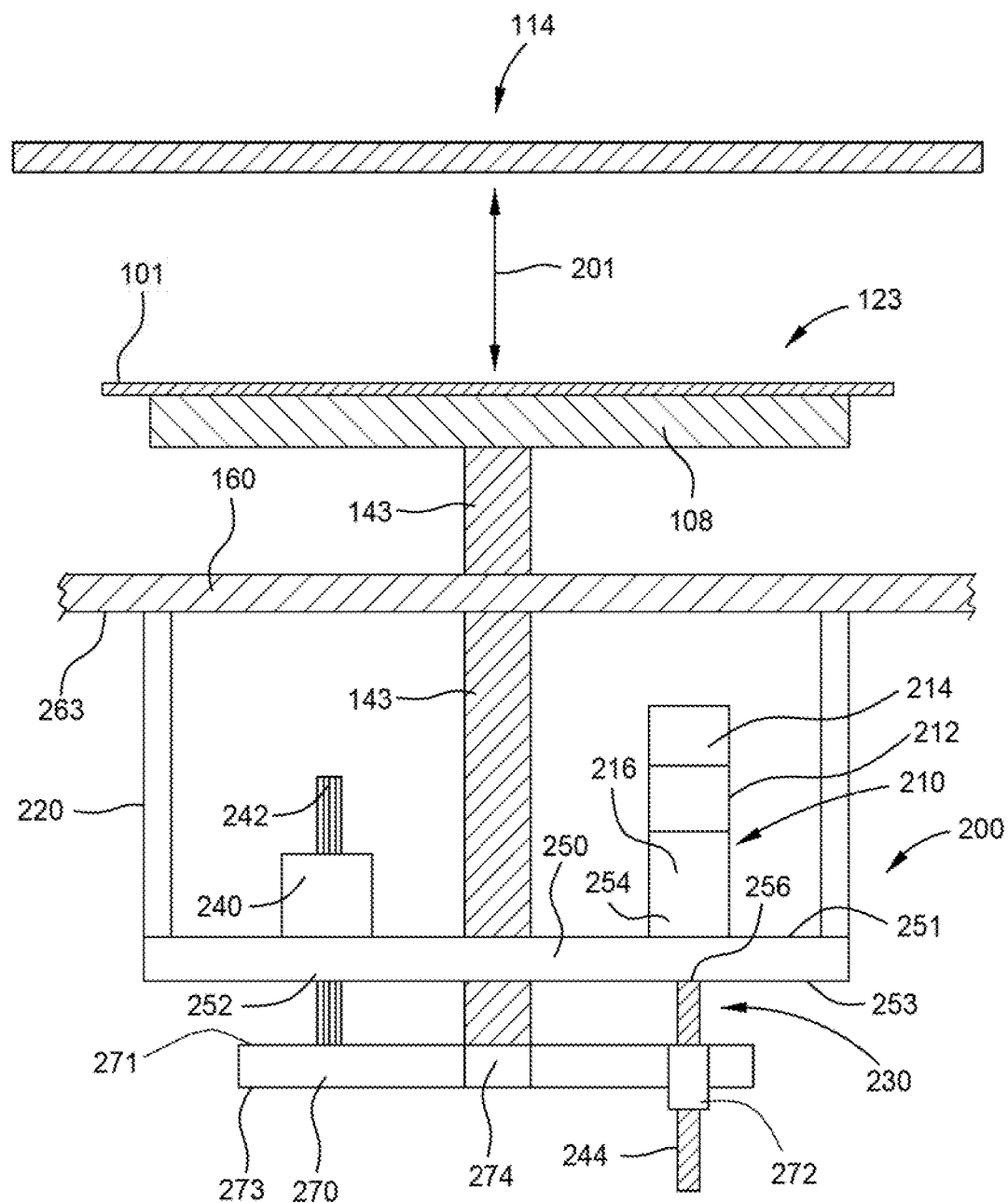
FIG. 2 illustrates a plan view of the high precision lift assembly for the substrate support assembly of FIG. 1.

FIG. 2 is a plan view of the lift assembly 200 utilized to control the elevation of the substrate support assembly 144 of FIG. 1. The high precision lift assembly 200 is hung under the process chamber 100 in a manner that allows for angular as well as limited x and y translation without any appreciable Z motion. The lift assembly 200 has a gimbal mount 220, a movement assembly 230, a frame 250, a platen 270 and an absolute linear encoder 240.

The frame 250 has a top surface 251 and a bottom surface 253. The gimbal mount 220 is attached to the top surface 251 of the frame 250. The frame 250 is coupled to an underside 263 of the chamber bottom wall 160 by the gimbal mount 220. The platen 270 is movably coupled to the frame 250 by the movement assembly 230. The platen 270 has an upper surface 271 and a lower surface 273. In some embodiments, the platen 270 is disposed above the top surface 251 of the fixed frame 250. In other embodiments, the platen 270 is disposed below the bottom surface 253 of the fixed frame 250. As illustrated, the discussion of FIG. 2 will proceed with the platen 270 disposed below the bottom surface 253 for simplicity though it should be appreciated that the platen 270 could alternatively be positioned above the fixed frame 250.

The shaft 143 of the pedestal 108 is mounted to the platen 270. The shaft 143 extends through the frame 250 to directly couple the pedestal 108 to the platen 270. Thus, as the platen 270 moves, the pedestal 108 moves a corresponding distance.

The absolute linear encoder 240 is positioned to record the position of the platen 270 relative to the fixed frame 250. In one embodiment, the absolute linear encoder 240 is disposed on the top surface 251 of the fixed frame 250. A rod 242 is fixedly coupled to the platen 270. The rod 242 extends from the platen 270 to the absolute linear encoder 240. The absolute linear encoder 240 records the actual motion of the rod 242 through the absolute linear encoder 240 which is indicative of a position for the platen 270. Alternately, the absolute linear encoder 240 may be disposed on the bottom surface 253 of the fixed frame 25.

In other embodiments, absolute linear encoder 240 may be mounted to the platen 270. The rod 242 may be fixedly coupled to the fixed frame 250 and extend through the absolute linear encoder for reporting the position of the platen 270. Alternately, the rod 242 may be fixedly coupled to the underside 263 of the chamber bottom wall 160. The rod 242 extends through the absolute linear encoder for reporting the position of the platen 270 relative to chamber bottom wall 160 or fixed frame 250 where the distance of the fixed frame 250 to the chamber bottom wall 160 does not change. The absolute linear encoder 240 may be disposed on the upper surface 271 of the platen 270. Alternately, the absolute linear encoder 240 may be disposed on the lower surface 273 of the platen 270.

The absolute linear encoder 240 is a sensor, transducer or readhead paired with a scale that encodes a vertical position of the shaft 143. The absolute linear encoder 240 reads the scale and converts the encoded position into an analog or digital signal, which can then be decoded into position by a digital readout or motion controller. The absolute linear encoder 240 may be an optical, magnetic, inductive, capacitive or eddy current sensor. The absolute linear encoder 240 is suitable to have a resolution of about 0.5 um. The absolute linear encoder 240 location information is non-volatile suitable for maintaining the accurate pedestal location information during servicing and throughout other operations including those where power is not provided to the system. The absolute linear encoder 240 eliminates hysteresis and the need to re-home lift after installation due to downtime and maintenance operations. The absolute position not related to wear or hysteresis.

It should be appreciated that the absolute linear encoder 240 may be any number of other high precision measurement devices suitable for reporting an absolute position of the shaft 143. For example, the absolute linear encoder 240 may high precision measuring device that accurately reads the position of the fixed frame 250 relative to the either the underside 263 of the chamber bottom wall 160 or the fixed frame 250. For example, the absolute linear encoder 240 may be an optical or laser micrometer suitable for measuring to within between about 0.1 um to about 10 um, such as between about 0.5 um and about 2 um. In one embodiment, the absolute linear encoder 240 maintains the positional accuracy of the pedestal 108 to within +1-2 um. In another embodiment, the absolute linear encoder 240 maintains the positional accuracy of the pedestal 108 between about 1 um to about 2 um.

The movement assembly 210 has a motor rotor encoder break module (MREBM) 210. In one embodiment, the MREBM 210 is coupled to the frame 250. Although the MREBM 210 is shown on the top surface 251 of the frame 250, it should be appreciated that the MREBM 210 may alternately be located on the lower surface 273 of the frame 250 or even the upper surface 271 or lower surface 273 of the platen 270. Although one location of the MREBM 210 may provide advantages over another location, operationally the locations are substantially similar. Thus, the following discussion will be with respect to the MREBM 210 located on the top surface 251 of the fixed frame 250. By extension, this also implies a lift rod 244, which may be attached to either the fixed frame 250 or the platen 270, will be discussed as attached to the platen 270.

The MREBM 210 has an actuator 212 and a rotary encoder 214. The MREBM 210 may additionally have a brake 216. The lift rod 244 and a coupling 272 interface with the actuator 212 to effect movement the platen 270 for raising and lowering the shaft 143 and the pedestal 108. The MREBM 210 has high tolerance thrust bearings 254 disposed therein the MREBM 210. The high tolerance thrust bearings may be a rotary or other suitable bearings permitting rotation between parts, and designed to support a predominantly axial load of the lift rod 244 controlling the movement of the shaft 143 and pedestal 108. For example, the high tolerance thrust bearings 254 (and/or item 272) may be a thrust ball bearings, cylindrical thrust roller bearings, tapered roller thrust bearings, spherical roller thrust bearings, fluid bearings, magnetic bearings, or other suitable bearing able to maintain a high tolerance for the positional accuracy of the lift rod 244. In one embodiment, a ball screw or similar which is part of the actuator 212 motor armature is coupled to platen 270 through a ball nut or similar which is high tolerance thrust bearings 272 suitable for zero backlash. The location of the guide for the pedestal shaft is mounted directly on the chamber bottom surface 263 guiding the pedestal to be perpendicular to the chamber bottom surface as well as guided for precise up and down linear motion.

The rotary encoder 214 is an electro-mechanical device that converts the angular position or motion of a shaft of the actuator 212 to analog or digital output signals. The rotary encoder 214 measures and records the actuator 212 movement of the platen 270. The rotary encoder 214 may be an absolute or incremental encoder. The output of an absolute encoder indicates the current shaft position. The output of an incremental encoder provides information about the motion of the shaft. In one embodiment, the rotary encoder 214 is an incremental encoder and provides positional feedback for the actuator 212.

The actuator 212 may be a servo motor, a linear motor, a rotary motor, a stepper motor or other suitable device for imparting movement in the lift rod 244 at a micrometer scale. The actuator 212 directly drives the lift rod 244, i.e., move the lift rod 244 up and down. The lift rod 244 may be any suitable rod such as a threaded rod, a tubular rod, rectangular bar, or any suitable ridged member for imparting movement. The coupling 272 may be a ball screw, a shaft coupling, a weld, or other suitable coupling configured to interface with the lift rod 244 for creating movement in the platen 270. For example, the lift rod 244 may be a threaded rod and the coupling 272 may be a ball screw and the rotation of the threaded rod by the actuator 212 causes the ball screw to thread the rod and move the platen 270 relative to the frame 250.

In another example, the actuator 212 may interface with a ball screw which rotates about a threaded lift rod 244 which is fastened to the platen 270 to effect movement of the platen 270 relative to the frame 250. In another example, the actuator 212 may be a linear motor which moves the lift rod 244 fixedly coupled to the platen 270, for moving the platen 270 relative to the frame 250. Thus, the examples stated above demonstrate one or more techniques for the actuator 212 to directly drive the movement of the platen 270. It is contemplated that other techniques may be equally employed for directly driving the platen 270 in a highly precise manner with the actuator 212.

The brake 216 is configured to stop movement of the lift rod 244 in a power down situation. The brake 216 is provided to keep the pedestal 108 from dropping if power is turned off or lost with the chamber at atmospheric pressure. Under vacuum, the brake 216 keeps the pedestal 108 from being sucked up into the interior volume 106 of the processing chamber 100 in the case of a loss of power. The brake 216 is part of the MREBM 210 and may be mounted accordingly. Alternately, or additionally, a break 219 may be coupled to the frame 250 or other suitable locations to stop the movement of the platen 270 attached to the pedestal 108.

It should be appreciated that the brake 216 may be fixed separately from the MREBM 210 and disposed on the top surface 251 of the fixed frame 250. Alternately, the brake 216 may be fixed separately from the MREBM 210 and disposed on the bottom surface 253 of the fixed frame 250. In yet other configurations, the brake 216 may be fixed separately from the MREBM 210 and disposed on the upper surface 271 of the platen 270. In yet other configurations, the brake 216 may be fixed separately from the MREBM 210 and disposed on the lower surface 273 of the platen 270.

The combination of MREBM 210 and absolute linear encoder 240 allows for precise movement and recordation of absolute position of the pedestal 108 for reliably producing nanometer and smaller features is one of the key technology challenges for next generation semiconductor devices. For example, with a targeted upper set-point for testing, even with the introduction of vibration, the set points were maintained between about +5 µm to about −7 µm of the targeted value. Advantageously, the lift assembly 200 during normal operation is suitable for the repeatedly providing the absolute position of the pedestal 108 reliably within +/−2 µm. It should be appreciated that the lift assembly 200 is suitable to achieve even higher precision such as +/−0.5 µm, or between about 0.5 µm and about 2 µm.

Figure 3:
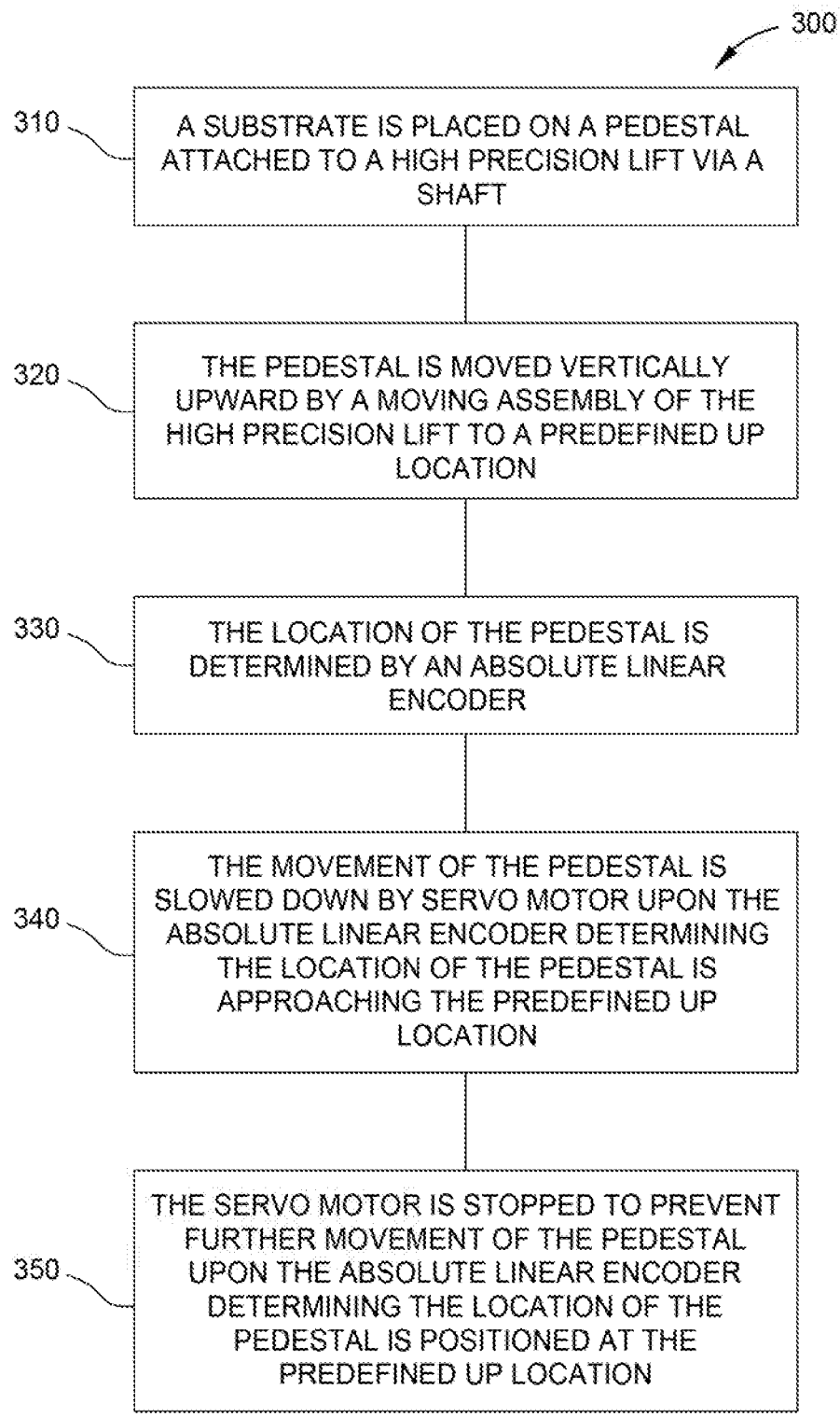
FIG. 3 illustrates a method of using the high precision lift assembly of FIG. 2.

FIG. 3 illustrates a method 300 for using the high precision lift assembly of FIG. 2. The method 300 begins at block 310 by placing a substrate n a pedestal attached to a high precision lift via a shaft. The substrate is placed on the pedestal for plasma processing in a plasma processing chamber where the pedestal is disposed therein. The substrate may be moved onto the pedestal by a robot. The substrate is processed with a recipe which determines, among other things, the height of the pedestal.

At block 320, the pedestal is moved vertically upward by a moving assembly of the high precision lift to a predefined elevated location. The moving assembly has a servo motor and a rotary encoder for reporting the movement provided by the servo motor. A brake is additionally provided to slow down and stop the movement of the high precision lift.

At block 330, an absolute linear encoder determines the location of the pedestal. The pedestal location information determined by the absolute linear encoder is maintained in non-volatile memory storage.

At block 340, upon the absolute linear encoder determining the location of the pedestal is approaching the predefined up location, the pedestal is slowed down by the servo motor.

At block 350, the servo motor is stopped upon the absolute linear encoder determining the location of the pedestal is positioned within +/−a threshold of the predefined elevated location. The threshold may be between about 0.1 um to about 10 um of the predefined elevation location, such as between about 0.5 um and about 2 um. The absolute linear encoder 240 maintains the positional accuracy of the pedestal 108 to between about 1 um to about 2 um.

The movement of the pedestal is slowed down using a programmed deceleration curve loaded into a drive module of the servo motor. The pedestal position is actively held and adjusted by the servo motor to actively respond to variations in thermal expansion, vibration and variations in pedestal load. The brake is activated to prevent further movement of the pedestal in a loss of power to the moving assembly of the lift. The predefined elevated location set the process recipe.

The pedestal is positioned to within the threshold of the predefined elevated location and is processed in the processing chamber according to the process recipe. After processing is complete, the servo motor is activated to lower the pedestal to a predefined lowered location. Upon the absolute linear encoder determining the location of the pedestal is approaching the predefined down location, the motion of the pedestal may be slowed using the brake and/or servo motor. Upon the pedestal reaching the predefined lowered location, the brake is activated and the servo motor is stopped to prevent further movement of the pedestal, thus, positioning the pedestal to within +/−2 um of the predefined down position.

While the foregoing is directed to specific examples, other and further examples may be devised without departing from the basic scope thereof, and the scope thereof is determined by the claims that follow.

What we claim is:

1. A pedestal lift assembly for a plasma processing chamber, the pedestal lift assembly comprising:
   a fixed frame;
   a platen configured to couple to a shaft of a pedestal disposed in the plasma processing chamber, the fixed frame disposed between the platen and the pedestal;
   an absolute linear encoder disposed on the fixed frame and coupled via a rod to the platen, wherein the absolute linear encoder is configured to detect incremental movement of the platen;
   a lift rod attached to the platen and extending through the fixed frame; and
   a movement assembly disposed on the fixed frame and moveably coupled to the lift rod, the movement assembly configured to move the lift rod in a first direction and a second direction, wherein the movement of the lift rod results in the platen traveling vertically relative to the fixed frame.

2. The pedestal lift assembly of claim 1, wherein the movement assembly further comprises:
   a servo motor, and
   a rotary encoder configured to provide positional information of the servo motor.

3. The pedestal lift assembly of claim 2, wherein the movement assembly is coupled to a top surface of the fixed frame.

4. The pedestal lift assembly of claim 2, wherein the movement assembly further comprises:
   a brake configured to interface with the lift rod and selectively prevent the movement thereof.

5. The pedestal lift assembly of claim 1, further comprising:
   a brake configured to interface with the shaft and selectively prevent the movement of the shaft.

6. The pedestal lift assembly of claim 1, wherein the absolute linear encoder has a resolution of at least about +/−2 um.

7. The pedestal lift assembly of claim 6, wherein the absolute linear encoder is disposed on a top surface of the fixed frame.

8. The pedestal lift assembly of claim 7, further comprising:
   a first column extending from the platen and through the absolute linear encoder, wherein the absolute linear encoder measures movement of the first column.

9. A plasma processing chamber, comprising:
   a body comprising:
      a lid;
      one or more walls; and
      a bottom, wherein the lid, walls and bottom define an internal processing volume;
   a substrate support assembly disposed in the interior volume, the substrate support assembly comprising:
      a pedestal; and
      a shaft coupled to the pedestal, the shaft extending from the internal processing volume and through the bottom of the body; and
   a pedestal lift assembly coupled to the shaft and configured to move the pedestal vertically, the pedestal lift assembly comprising:
      a fixed frame;
      a platen configured to couple to the shaft of the pedestal, the fixed frame disposed between the platen and the pedestal;
      an absolute linear encoder disposed on the fixed frame and coupled via a rod to the platen, wherein the absolute linear encoder is configured to detect incremental movement of the platen;
      a lift rod coupled to the platen and extending through the fixed frame; and
      a movement assembly disposed on the fixed frame and moveably coupled to the lift rod, the movement assembly configured to move the lift rod in a first direction and a second direction, wherein the movement of the lift rod results in the displacement of the pedestal.

10. The plasma processing chamber of claim 8, wherein the movement assembly further comprises:
    a servo motor, and
    a rotary encoder configured to provide positional information for the servo motor.

11. The plasma processing chamber of claim 9, wherein the movement assembly is coupled to a top surface of the fixed frame.

12. The plasma processing chamber of claim 9, wherein the movement assembly further comprises:
    a brake configured to interface with the lift rod and selectively prevent the movement of the lift rod.

13. The plasma processing chamber of claim 8, wherein the pedestal lift assembly further comprising:
    a brake configured to interface with the shaft and selectively prevent the movement of the shaft.

14. The plasma processing chamber of claim 8, wherein the absolute linear encoder has a resolution of at least about +/−2 um.

15. The plasma processing chamber of claim 13, wherein the pedestal lift assembly further comprises:
 a first column extending from the platen and through the absolute linear encoder, wherein the absolute linear encoder measures the movement of the first column.

16. A method for processing a substrate in a plasma processing chamber, the method comprising:
 placing a substrate on a pedestal attached to a lift via a shaft coupled to a platen;
 moving the pedestal vertically upward by a moving assembly disposed on a fixed frame of the lift to a predefined up location, wherein the shaft extends through the fixed frame;
 determining a location of the pedestal using an absolute linear encoder disposed on the fixed frame and coupled via a rod to the platen;
 slowing the movement of the pedestal using the moving assembly upon the absolute linear encoder determining the location of the pedestal is approaching the predefined elevated location; and
 stopping the moving assembly to prevent further movement of the pedestal upon the absolute linear encoder determining the location of the pedestal is positioned at or near the predefined elevated location.

17. The method of claim 16 wherein the pedestal is stopped within +/−2 um of the predefined up location determined by a programmed deceleration cure loaded into a drive module of the moving assembly.

18. The method of claim 16 further comprising:
 actively holding and adjusting the pedestal position by responding to variations in thermal expansion, vibration and variations in a load on the pedestal.

19. The method of claim 17, wherein the moving assembly has a servo motor and a rotary encoder for reporting the movement provided by the servo motor.

20. The method of claim 19 further comprising:
 positioning the pedestal to within +/−2 um of the predefined elevated location;
 processing the substrate in the processing chamber;
 activating the servo motor to lower the pedestal to a predefined lowered location;
 determining the location of the pedestal is approaching the predefined down location with the absolute linear encoder; and
 stopping the servo motor preventing further movement of the pedestal upon the absolute linear encoder determining the location of the pedestal is positioned to within +/−2 um of the predefined down position.

21. The method of claim 20; further comprising:
 activating the brake to prevent further movement of the pedestal in a loss of power to the moving assembly of the lift.

* * * * *